United States Patent
Chen

(10) Patent No.: US 12,125,752 B2
(45) Date of Patent: Oct. 22, 2024

(54) METHOD FOR GRINDING WAFER AND WAFER FAILURE ANALYSIS METHOD

(71) Applicant: CHANGXIN MEMORY TECHNOLOGIES, INC., Hefei (CN)

(72) Inventor: Jiabao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 484 days.

(21) Appl. No.: 17/647,296

(22) Filed: Jan. 6, 2022

(65) Prior Publication Data

US 2022/0352039 A1 Nov. 3, 2022

Related U.S. Application Data

(63) Continuation of application No. PCT/CN2021/112272, filed on Aug. 12, 2021.

(30) Foreign Application Priority Data

Apr. 28, 2021 (CN) .......................... 202110465899.4

(51) Int. Cl.
*H01L 21/66* (2006.01)
*H01L 21/304* (2006.01)

(52) U.S. Cl.
CPC ............ *H01L 22/12* (2013.01); *H01L 21/304* (2013.01); *H01L 22/30* (2013.01)

(58) Field of Classification Search
CPC ......... H01L 22/12; H01L 22/10; H01L 22/30; H01L 22/32; H01L 22/34; H01L 21/304
See application file for complete search history.

(56) References Cited

U.S. PATENT DOCUMENTS

| | | | |
|---|---|---|---|
| 7,655,482 B2* | 2/2010 | Satya | H01L 22/34 438/17 |
| 2013/0292673 A1* | 11/2013 | Phua | H01L 21/565 438/15 |
| 2021/0407871 A1* | 12/2021 | Lei | H01L 23/58 |
| 2022/0077007 A1* | 3/2022 | Kim | H01L 25/18 |
| 2023/0018710 A1* | 1/2023 | Huang | H01L 22/32 |
| 2023/0090265 A1* | 3/2023 | Keser | H01L 24/92 257/668 |

FOREIGN PATENT DOCUMENTS

| | | |
|---|---|---|
| CN | 101657894 A | 2/2010 |
| CN | 104849643 A | 8/2015 |

(Continued)

OTHER PUBLICATIONS

International Search Report in Application No. PCT/CN2021/112272, mailed on Dec. 24, 2021.

*Primary Examiner* — Michael M Trinh
(74) *Attorney, Agent, or Firm* — Syncoda LLC; Feng Ma

(57) ABSTRACT

A method for grinding the wafer includes: an initial wafer of which an edge has a test address is provided; a recombined water of which the test address is located in the middle is formed; a following circulation step is performed: a protective layer at least located above the test address is formed on an existing layer of the recombined water; the uncovered existing layer is grinded; the protective layer and the existing layer which is remaining are removed. It is determined whether the test address is exposed, if not, the next circulation step is performed.

20 Claims, 6 Drawing Sheets

(56) References Cited

FOREIGN PATENT DOCUMENTS

| | | | |
|---|---|---|---|
| CN | 105334084 | A | 2/2016 |
| CN | 107738141 | A | 2/2018 |
| CN | 108436604 | A | 8/2018 |
| CN | 109406555 | A | 3/2019 |
| CN | 109870336 | A | 6/2019 |
| CN | 111433311 | A | 7/2020 |
| CN | 111613524 | A | 9/2020 |
| CN | 112086455 | A | 12/2020 |
| CN | 109406555 | * | 12/2021 |

* cited by examiner

METHOD FOR GRINDING WAFER AND WAFER FAILURE ANALYSIS METHOD

CROSS-REFERENCE TO RELATED APPLICATIONS

This is a continuation of International Application No. PCT/CN2021/112272 filed on Aug. 12, 2021, which claims priority to Chinese Patent Application No. 202110465899.4 filed on Apr. 28, 2021. The disclosures of the above-referenced applications are hereby incorporated by reference in their entirety.

BACKGROUND

Failure analysis usually uses a mode of chemical mechanical grinding to grind a wafer. After a location point or a failure point (namely a test address) is exposed, a nano-probe is used to test and analyze the location point or the failure point.

SUMMARY

The disclosure relates to the field of semiconductor manufacturing technologies, and in particular to a method for grinding a wafer and a wafer failure analysis method.

A method for grinding a wafer and a wafer failure analysis method are provided by some embodiments of the disclosure.

According to some embodiments, the disclosure provides a method for grinding a wafer, including the following steps:
an initial wafer including a plurality of bare chips is provided, and at least one of the plurality of bare chips located at an edge of the initial wafer has a test address;
the plurality of the bare chips is split and recombined, as to form a recombined wafer, so that the at least one of the plurality of bare chips having the test address are located in a middle of the recombined wafer;
a following circulation step is performed at least once, and the circulation step includes the following operations;
a protective layer is formed an existing layer exposed in the recombined wafer, and the protective layer is at least located above the test address;
the existing layer in the recombined wafer that is not covered by the protective layer is grinded, as to expose a next layer adjacent to the existing layer;
the protective layer and the existing layer which is remaining under the protective layer are removed, as to expose the next layer located under the protective layer;
It is determined whether the test address is exposed, and if not, the next layer which is exposed is used as an existing layer of the next circulation step.

According to other embodiments, the disclosure further provides a wafer failure analysis method, including the following steps:
any one of the above methods is used to grind a wafer, as to expose a test address;
a nano-probe is used to perform a failure test on the test address.

DETAILED DESCRIPTION

Specific embodiments of a method for grinding a wafer and a wafer failure analysis method provided by the disclosure are described in detail below with reference to drawings.

The test address of the failure analysis is usually located at a Peripheral Gate (PG) layer in an edge area of the wafer, and a plurality of metal interconnection layers is usually formed on the PG layer. Therefore, it is necessary to grind the wafer before the failure analysis, as to expose the PG layer. However, in a process of grinding the wafer, because the grinding speed of the edge area of the wafer is faster, it is easy to form an inclined surface (namely, with a slope) in the edge area of the wafer, so that one metal interconnection layer adjacent to the test address may not be completely removed, the remaining metal layer is easily connected with other metals having uncertain factors, as to cause Gate-Body Leakage, and ultimately, the accuracy and reliability of a test result are affected. In addition, after a traditional method for grinding a wafer is used for grinding, only a small part of the test address may be exposed, and a destructive bridge connection may appear between the remaining metal interconnection layers, thereby the Gate-Body Leakage may also be caused.

Various embodiments of the present disclosure can improve the wafer grinding quality and improve the accuracy and reliability of the subsequent failure analysis.

Figure 1:
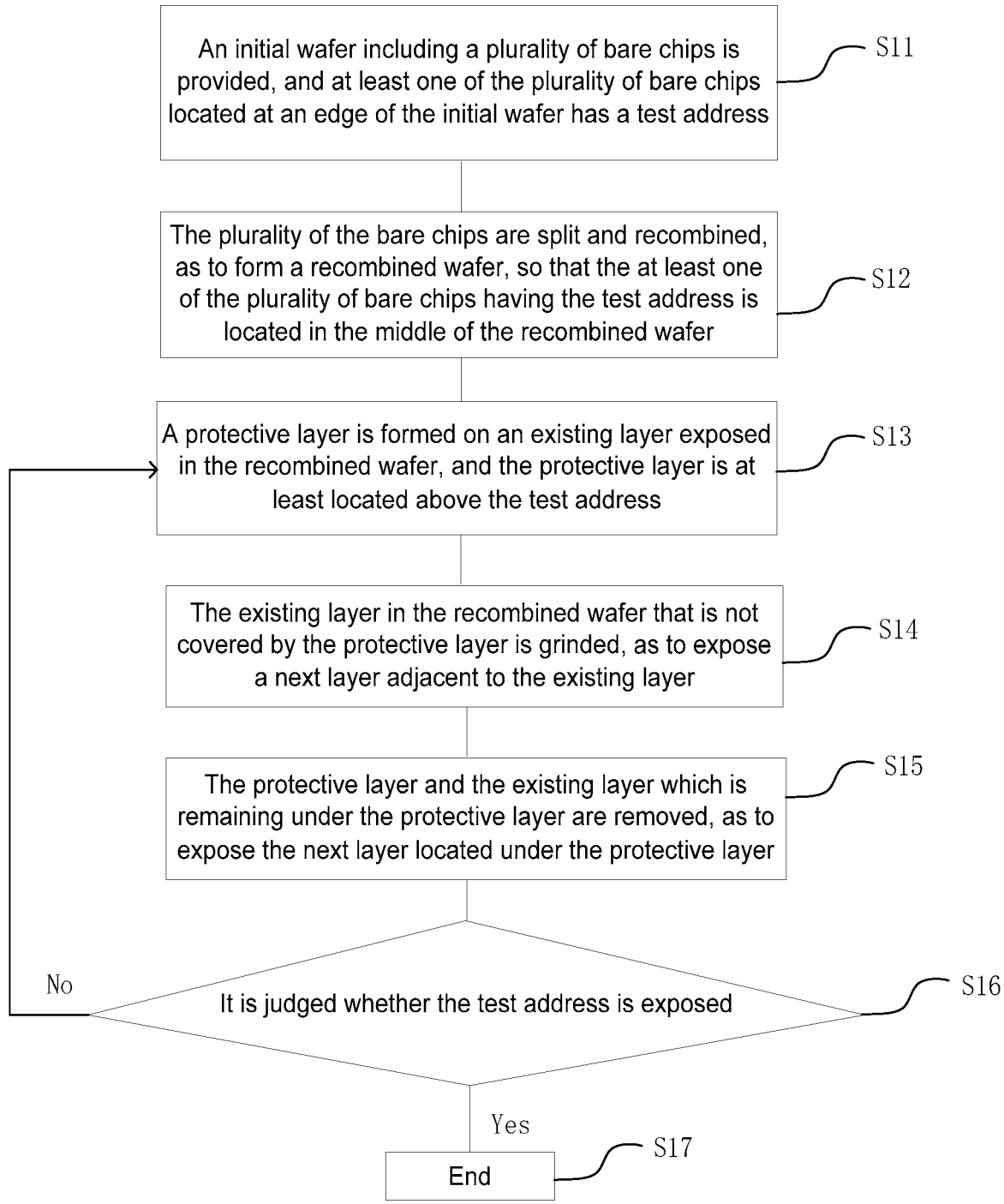
FIG. 1 is a flow diagram of a method for grinding a wafer in some embodiments of the disclosure.
Figure 2A:
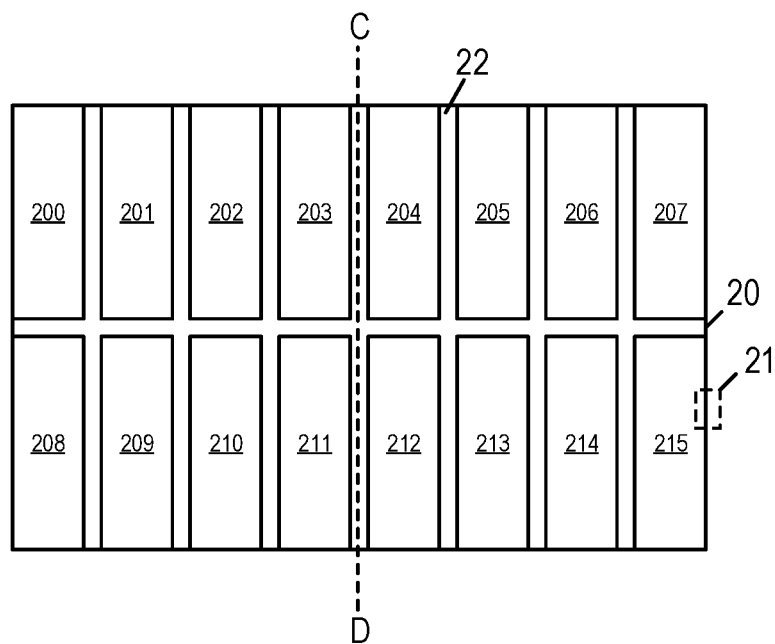
FIG. 2A is a first schematic diagram in a process of grinding a wafer in some embodiments of the disclosure.

Some embodiments of the present disclosure provide a method for grinding a wafer. FIG. 1 is a flow diagram of a method for grinding a wafer in some embodiments of the disclosure, and FIGS. 2A-2H are main schematic diagrams in a process of grinding a wafer in some embodiments of the disclosure. As shown in FIG. 1 and FIGS. 2A-2H, the method for grinding the wafer provided in this embodiment includes the following steps:

In S11, an initial wafer 20 including a plurality of bare chips is provided, and at least one of the plurality of bare chips located at an edge of the initial wafer 20 has a test address 21, as shown in FIG. 2A.

Specifically, the initial wafer 20 has the plurality of the bare chips arranged in an array. FIG. 2A shows that the initial wafer 20 includes 16 bare chips arranged in a two-dimensional array (namely, a first bare chip 200 to a sixteenth bare chip 215), herein the sixteenth bare chip 215 located at the edge of the initial wafer 20 has the test address 21 for failure analysis. Each one of the plurality of bare chips has a plurality of Active Areas (AA) arranged in an array, and each of the AAs has a plurality of semiconductor layers stacked in a direction perpendicular to the initial wafer 20, such as a peripheral gate layer, a gate contact layer located above the peripheral gate layer, a first metal interconnection layer located above the gate contact layer, a first contact plug located above the first metal interconnection layer, a second metal interconnection layer located above the first contact plug, and a second contact plug located above the second metal interconnection layer. In order to ensure the accuracy of a test result, the test address 21 is usually arranged inside the at least one of the plurality of bare chips, as to prevent the test address 21 from being affected by the external environment. For example, the test address 21 may be the peripheral gate layer or the gate contact layer. The plurality mentioned in this specific embodiment refers to two or more than two.

Figure 2B:
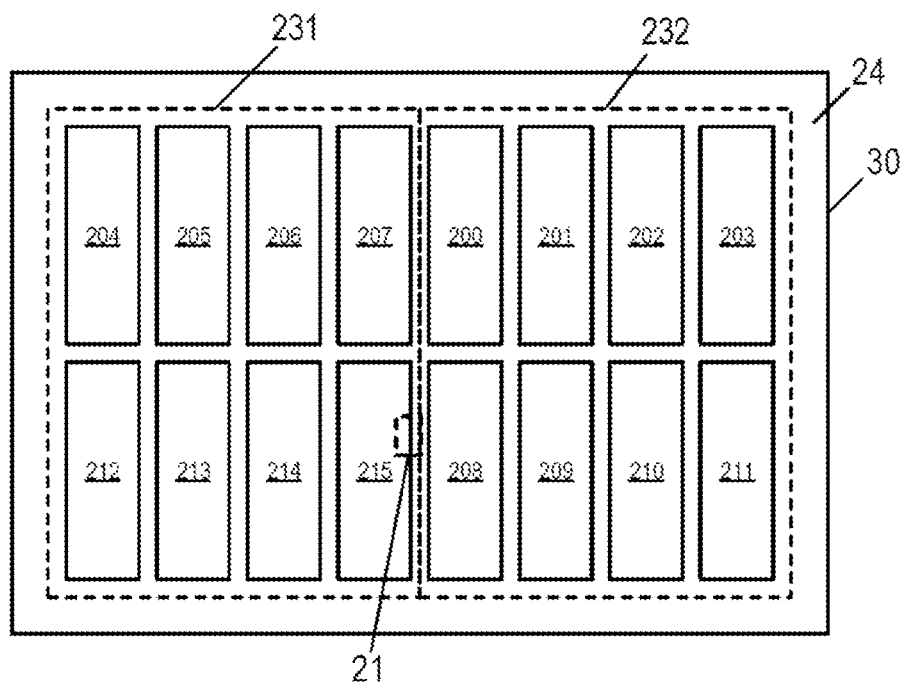
FIG. 2B is a second schematic diagram in a process of grinding a wafer in some embodiments of the disclosure.

In S12, the plurality of the bare chips are split and recombined as to form a recombined wafer 30, so that the at least one of the plurality of bare chips having the test address 21 is located in a middle of the recombined wafer 30, as shown in FIG. 2B.

In an example, the initial wafer 20 has a plurality of cutting lanes 22 for dividing two adjacent bare chips; the specific step of forming the recombined wafer 30 includes:

The initial wafer 20 is cut along the plurality of cutting lanes 22, as to form a plurality of cutting blocks, and each of the plurality of cutting blocks has a number of the bare chips;

The plurality of cutting blocks is spliced, as to form the recombined wafer 30, so that the at least one of the plurality of bare chips having the test address 21 is located in the middle of the recombined wafer 30.

In a process of chemical mechanical grinding, the grinding speed is faster in an edge position of the wafer, thereby it is easy to form a slope on the edge of the wafer. In this specific embodiment, the initial wafer 20 is cut along the plurality of cutting lanes, the initial wafer 20 is divided into the plurality of cutting blocks, and then the recombined wafer 30 is formed by arrangement and recombination, so that the position of the at least one of the plurality of bare chips having the test address 21 is located in the middle of the recombined wafer 30, thereby a problem that the grinding slope easily appears in the grinding process because the test address 21 is located at the edge of the wafer is avoided. In this specific embodiment, the initial wafer 20 is cut along the plurality of cutting lanes 22, it may be that the initial wafer 20 is cut along only one cutting lane 22, as to form two cutting blocks; or, it may also be that the initial wafer 20 is cut along a number of the cutting lanes 22, as to form the plurality of cutting blocks.

In an example, the specific step of forming the plurality of cutting blocks includes:

The initial wafer 20 is cut along one of the plurality of cutting lanes located in a middle of the initial wafer 20, as to form a first cutting block 231 and a second cutting block 232, and an edge of the first cutting block 231 includes the at least one of the plurality of bare chips having the test address 21.

In order to simplify the cutting and recombining steps, in this specific embodiment, the initial wafer 20 is cut along the middle of the initial wafer 20, and the initial wafer 20 is divided into the first cutting block 231 and the second cutting block 231. After that, the edge at one side, having the test address 21, of the first cutting block 231 is spliced with the edge of the second cutting block 232, as to form the recombined wafer 30, as shown in FIG. 2B.

In an example, the specific step of splicing the first cutting block 231 and the second cutting block 232 includes:

A substrate 24 is provided;

The first cutting block 231 and the second cutting block 232 are pasted on a surface of the substrate 24, and the first cutting block 231 and the second cutting block 232 are bonded.

In an example, the specific step of pasting the first cutting block 231 and the second cutting block 232 on the surface of the substrate 24, and bonding the first cutting block 231 and the second cutting block 232 includes:

A first curing glue is coated on the surface of the substrate 24;

The first cutting block 231 and the second cutting block 232 are placed on the surface of the substrate 24, and the edge of the first cutting block 231 is aligned and connected with the edge of the second cutting block 232;

The first curing glue is baked.

Specifically, the substrate 24 is used to support and bear the first cutting block 231 and the second cutting block 232. After an area, used to support and bear the first cutting block 231 and the second cutting block 232, on the surface of the substrate 24 is coated with the first curing glue, the first cutting block 231 and the second cutting block 232 are aligned and placed on the surface of the substrate 24, and the edge, having the test address 21, of the first cutting block 231 is aligned and connected with the edge of the second cutting block 232. After that, the substrate 24 is baked, so that the first curing glue is cured. The baking time is determined according to the types of the first curing glue and the applied dose of the first curing glue, for example, it may be 20 minutes. After baking, the substrate is naturally cooled, for example, it is placed and cooled for 5 minutes.

In the recombined wafer 30, the second cutting block 232 is connected with the edge, having the test address 21, of the first cutting block 231. On the one hand, it may prevent a problem that the first cutting block 231 is broken because of a pressure suffered in the grinding process; and on the other hand, the second cutting block 232 may also improve the flatness of the area above the test address 21 in the grinding process, and support the protective layer 26 while the protective layer 26 is subsequently formed above the test address 21, as to ensure that the protective layer 26 may effectively cover the area above the test address 21.

In an example, a top surface of the second cutting block 232 after bonding is lower than a top surface of the first cutting block 231, or the top surface of the second cutting block 232 after bonding is flush with the top surface of the first cutting block 231.

Specifically, by enabling the top surface of the second cutting block 232 in the recombined wafer 30 to be lower than or flush with the top surface of the first cutting block 231, the flatness of the subsequently formed protective layer 26 may be improved, thereby the final wafer grinding effect is further improved.

Figure 2C:
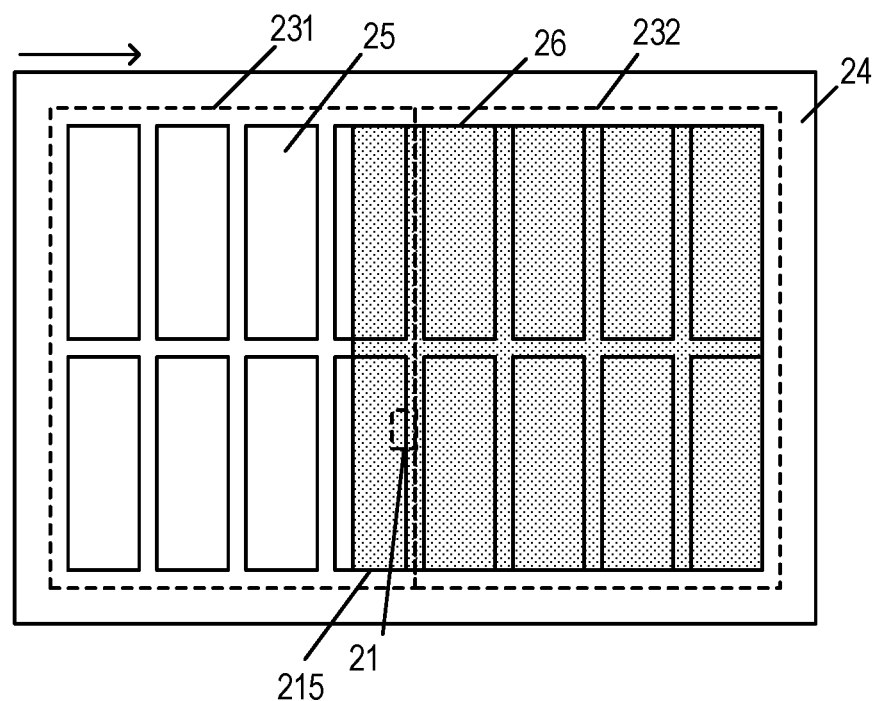
FIG. 2C is a third schematic diagram in a process of grinding a wafer in some embodiments of the disclosure.

A following circulation step is performed at least once, and the circulation step includes:

In S13, a protective layer 26 is formed on an existing layer 25 exposed in the recombined wafer 30, and the protective layer 26 is at least located above the test address 21, as shown in FIG. 2C.

In an example, the specific step of forming the protective layer 26 on the existing layer 25 exposed in the recombined wafer 30 includes:

A second curing glue is coated on the existing layer 25 exposed in the recombined wafer 30.

The second curing glue is baked, as to form the protective layer 26.

Specifically, the existence of the second cutting block 232 may effectively avoid the second curing glue from being adsorbed from the surface of the first cutting block 231 to the surface of the substrate 24 in a baking process, and it is ensured that the protective layer 26 may be effectively formed on the surface of the first cutting block 231.

In an example, a type of the first curing glue and a type of the second curing glue are the same.

In an example, the first curing glue and the second curing glue are both mixed glue composed of an epoxy resin and a curing agent.

In an example, the protective layer 26 covers the at least one of the plurality of bare chips having the test address 21, a gap between the first cutting block 231 and the second cutting block 232, and the second cutting block 232.

Specifically, by setting the types of the first curing glue and the second curing glue to be the same, in a process of coating the second curing glue, a connection gap between the first cutting block 231 and the second cutting blocks 232 may be supplemented with the second curing glue, as to ensure the smooth transition of the protective layer 26 between the first cutting block 231 and the second cutting block 232. The type of the first curing glue and the type of the second curing glue are the same, and both are made by mixing the epoxy resin and the curing agent at a weight ratio of 9:1.

Figure 2D:
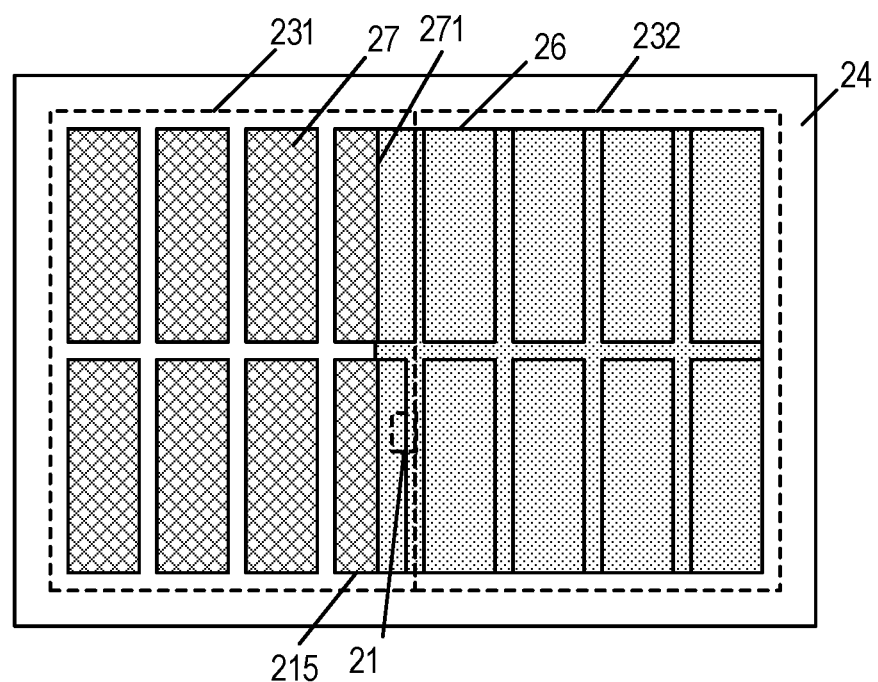
FIG. 2D is a fourth schematic diagram in a process of grinding a wafer in some embodiments of the disclosure.
Figure 2E:
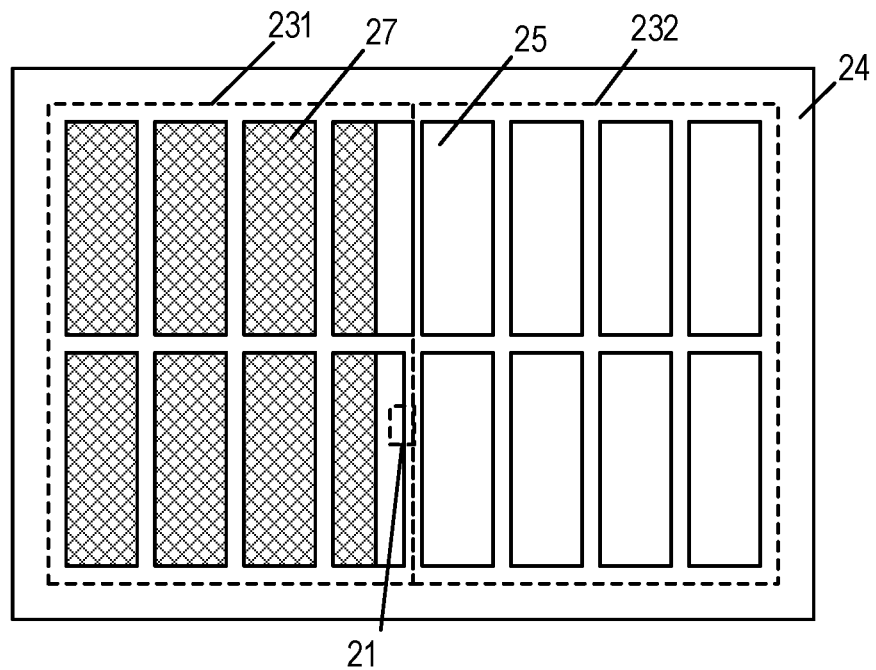
FIG. 2E is a fifth schematic diagram in a process of grinding a wafer in some embodiments of the disclosure.

In S14, the existing layer 25 in the recombined wafer 30 that is not covered by the protective layer 26 is grinded, as to expose a next layer 27 adjacent to the existing layer 26, as shown in FIG. 2D.

Figure 2F:
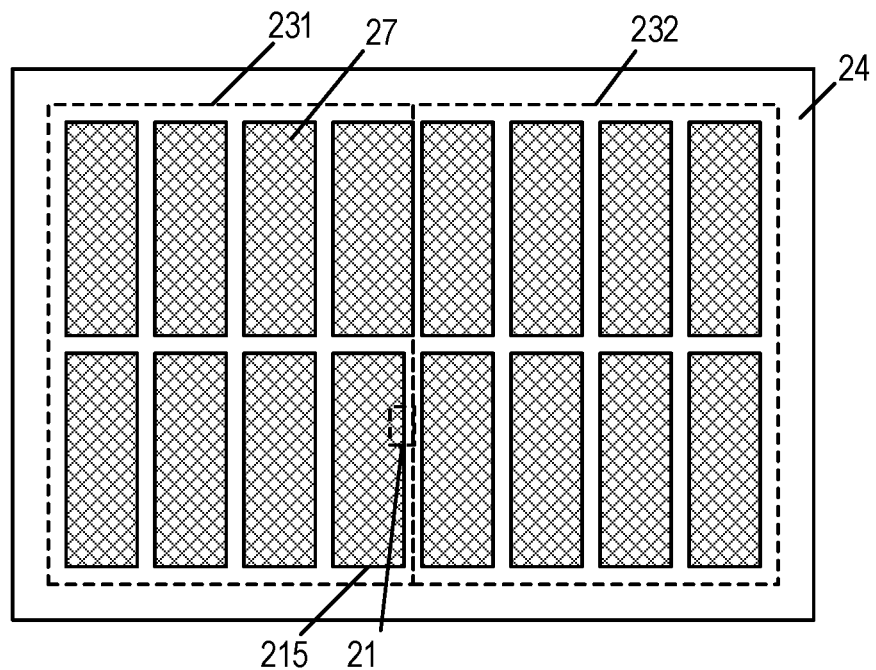
FIG. 2F is a sixth schematic diagram in a process of grinding a wafer in some embodiments of the disclosure.

In S15, the protective layer 26 and the existing layer 25 which is remaining under the protective layer 26 are removed, as to expose the next layer 27 located under the protective layer 26, as shown in FIG. 2F.

In S16, it is determined whether the test address 21 is exposed, and if not, the next layer 27 which is exposed is used as an existing layer of the next circulation step. If it is determined that the test address is completely exposed, S17 is performed, namely, the circulation step is ended.

In an example, the specific step of grinding the existing layer 25 in the recombined wafer 30 that is not covered by the protective layer 26 includes:

It is started from the edge of the first cutting block 231, and the existing layer 25 in the first cutting block 231 that is not covered by the protective layer 26 is grinded along a direction in which the first cutting block 231 points to the second cutting block 232.

Specifically, along a direction indicated by an arrow in FIG. 2C, it is started from the edge, away from the second cutting block 232, of the first cutting block 231, chemical mechanical grinding is performed on an area in the first cutting block 231 that is not covered by the protective layer 26. In a process of grinding the existing layer 25, grinding liquid may be selected according to the specific material of the existing layer 25. For example, the existing layer 25 is a third metal interconnection layer, and mixed liquid of silicon dioxide with a particle size of 0.5 μm and an active agent with a PH of 9 may be used as the grinding liquid.

In an example, the specific step of removing the protective layer 26 and the existing layer 25 which is remaining under the protective layer 26 includes:

It is determined whether a horizontal distance between the edge of the next layer 27 which is exposed and the test address 21 is within a preset range, if so, the protective layer 26 and the existing layer 25 which is remaining under the protective layer 26 are removed, and the preset range is greater than or equal to a length of 1 bare chip and less than or equal to a sum of lengths of 3 bare chips.

Specifically, in order to avoid damage to the protective layer 26 above the test address 21 while the existing layer 25 that is not covered by the protective layer 26 is grinded, thereby the protective effect of the protective layer 26 to the test address 21 is affected, it is determined whether the horizontal distance between the edge 271, towards the second cutting block 232, of the next layer 27 which is exposed and the test address 21 enters the preset range, if so, after the existing chemical mechanical grinding process is stopped, the protective layer 26 and the existing layer 25 which is remaining under the protective layer 26 are removed. The dimensions of each one of the plurality of bare chips on the recombined wafer 30 are all the same. For example, while the horizontal distance between the edge of the next layer 27 which is exposed and the test address 21 is equal to the sum of the lengths of 2 bare chips, the existing chemical mechanical grinding process is stopped. The length of a bare chip refers to the length of the bare chip along the direction in which the first cutting block 231 points to the second cutting block 232. The horizontal distance between the edge of the next layer 27 and the test address 21 refers to a distance between a projection of the edge 217, towards the second cutting block 232, of the next layer 27 which is exposed on the substrate 24 and a projection of the test address 21 on the substrate 24.

In an example, the specific step of removing the protective layer 26 and the existing layer 25 which is remaining under the protective layer 26 includes:

A sandpaper is used to grind and remove the protective layer 26;

A grinder is used to remove the existing layer 25 which is remaining.

In an example, the sandpaper is diamond sandpaper with a particle size of 0.5 μm or 1 μm.

In an example, a grinding rotation speed of the grinder is less than 150 revolutions per minute.

Specifically, the diamond sandpaper with the particle size of 0.5 μm or 1 μm may be firstly used to gently grind off all of the protective layers 26, as to expose the existing layer 25 under the protective layer 26. Then, the grinder gently polishes the exposed existing layer 25 at the grinding rotation speed of less than 150 revolutions per minute, until the next layer 27 located under the position of the protective layer 26 is exposed.

Figure 2G:
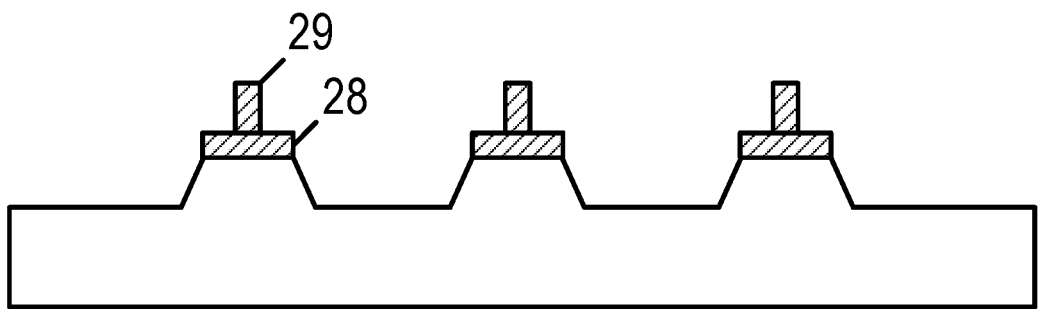
FIG. 2G is a seventh schematic diagram in a process of grinding a wafer in some embodiments of the disclosure.
Figure 2H:
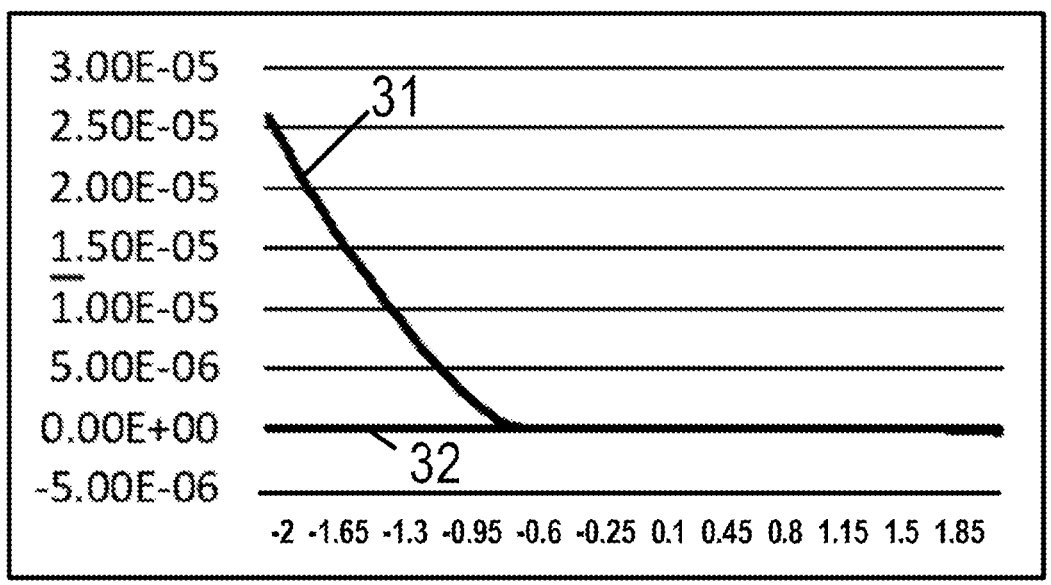
FIG. 2H is an eighth schematic diagram in a process of grinding a wafer in some embodiments of the disclosure.

FIG. 2G is a schematic diagram of the test address 21 exposed after grinding. As shown in FIG. 2G, the method for grinding the wafer provided in this specific embodiment may be used to completely expose a gate contact layer 29 above a peripheral gate layer 28, thereby the smooth progress of subsequent wafer failure analysis is ensured. FIG. 2H is a schematic diagram of Gate-Body Leakage after grinding. The abscissa in FIG. 2H represents the magnitude of the gate applied voltage (V), and the ordinate represents the magnitude of the Gate-Body Leakage (A). It may be seen from FIG. 2H that, by using the method for grinding the wafer provided in this specific embodiment, the Gate-Body Leakage may be reduced from a μA-level to a pA-level, and a problem of the Gate-Body Leakage is greatly improved.

Moreover, the disclosure further provides a wafer failure analysis method. In this specific embodiment, the method for grinding the wafer shown in FIG. 1 and FIGS. 2A-2H may be used to grind a wafer for failure analysis. The wafer failure analysis method includes the following steps:

The above methods is used to grind a wafer, as to expose a test address;

A nano-probe is used to perform a failure test on the test address.

In the method for grinding the wafer and the wafer failure analysis method provided by this specific embodiment, the initial wafer to be grinded is split and recombined, and the position of the at least one of the plurality of bare chips having the test address is adjusted to the middle of the recombined wafer, thereby a problem that the grinding slope easily appears because the at least one of the plurality of bare chips having the test address is located in an edge position is avoided. In addition, based on the disclosure, in a process of grinding other areas, the protective layer covers the test address, and after the other areas are grinded, the protective layer is removed, and an area above the test address is separately grinded within a small range, thereby the test address may be completely and flatly exposed, a problem of metal interconnection layer bridge connection may not appear above the test address, and a problem of Gate-Body Leakage is reduced or even avoided.

The above are only preferred embodiments of the disclosure. It should be pointed out that for those of ordinary skill in the art, a plurality of improvements and modifications may be made without departing from the principle of the disclosure, and these improvements and modifications should also be considered as a scope of protection of the disclosure.

What is claimed is:

1. A method for grinding a wafer, comprising:
   providing an initial wafer comprising a plurality of bare chips, and at least one of the plurality of bare chips located at an edge of the initial wafer having a test address;
   splitting and recombining the plurality of the bare chips, as to form a recombined wafer, so that the at least one of the plurality of bare chips having the test address being located in a middle of the recombined wafer;
   performing a following circulation step at least once, and the circulation step comprising:
   forming a protective layer on an existing layer exposed in the recombined wafer, wherein the protective layer is at least located above the test address;
   grinding the existing layer in the recombined wafer that is not covered by the protective layer, as to expose a next layer adjacent to the existing layer;
   removing the protective layer and the existing layer which is remaining under the protective layer, as to expose the next layer located under the protective layer; and
   judging whether the test address is exposed, and if not, the next layer which is exposed being used as an existing layer of the next circulation step.

2. The method for grinding the wafer according to claim 1, wherein the initial wafer is provided with a plurality of cutting lanes for dividing two adjacent bare chips; forming the recombined wafer comprises:
   cutting the initial wafer along the plurality of cutting lanes, as to form a plurality of cutting blocks, wherein each of the plurality of cutting blocks has a number of the bare chips; and
   splicing the plurality of cutting blocks, as to form the recombined wafer, so that the at least one of the plurality of bare chips having the test address being located in the middle of the recombined wafer.

3. The method for grinding the wafer according to claim 2, wherein said forming the plurality of cutting blocks comprises:
   cutting the initial wafer along one of the plurality of cutting lanes located in a middle of the initial wafer, as to form a first cutting block and a second cutting block, wherein an edge of the first cutting block comprises the at least one of the plurality of bare chips having the test address.

4. The method for grinding the wafer according to claim 3, wherein said splicing the first cutting block and the second cutting block comprises:
   providing a base; and
   pasting the first cutting block and the second cutting block on a surface of the substrate, and bonding the first cutting block and the second cutting block.

5. The method for grinding the wafer according to claim 4, wherein said pasting the first cutting block and the second cutting block on the surface of the substrate, and bonding the first cutting block and the second cutting block comprises:
   coating a first curing glue on the surface of the substrate;
   placing the first cutting block and the second cutting block on the surface of the substrate, wherein an edge of the first cutting block is aligned and connected with an edge of the second cutting block; and
   baking the first curing glue.

6. The method for grinding the wafer according to claim 4, wherein a top surface of the second cutting block after bonding is lower than a top surface of the first cutting block, or the top surface of the second cutting block after bonding is flush with the top surface of the first cutting block.

7. The method for grinding the wafer according to claim 5, wherein said forming the protective layer on the existing layer exposed in the recombined water comprises:
   coating a second curing glue on the existing layer exposed in the recombined water; and
   baking the second curing glue, as to form the protective layer.

8. The method for grinding the wafer according to claim 7, wherein a type of the first curing glue and a type of the second curing glue are the same.

9. The method for grinding the wafer according to claim 7, wherein the first curing glue and the second curing glue are both mixed glue composed of an epoxy resin and a curing agent.

10. The method for grinding the wafer according to claim 4, wherein the protective layer covers the at least one of the plurality of bare chips having the test address, a gap between the first cutting block and the second cutting block, and the second cutting block.

11. The method for grinding the wafer according to claim 4, wherein said grinding the existing layer in the recombined wafer that is not covered by the protective layer comprises:
    starting from the edge of the first cutting block, and grinding the existing layer in the first cutting block that is not covered by the protective layer along a direction in which the first cutting block points to the second cutting block.

12. The method for grinding the wafer according to claim 1, wherein said removing the protective layer and the existing layer which is remaining under the protective layer comprises:
    judging whether a horizontal distance between an edge of the next layer which is exposed and the test address is within a preset range, if so, removing the protective layer and the existing layer which is remaining under the protective layer, wherein the preset range is set to be greater than or equal to a length of 1 bare chip and less than or equal to a sum of lengths of 3 bare chips.

13. The method for grinding the wafer according to claim 7, wherein said removing the protective layer and the existing layer which is remaining under the protective layer comprises:
    using a sandpaper to grind and remove the protective layer; and
    using a grinder to remove the existing layer which is remaining.

14. The method for grinding the wafer according to claim 13, wherein the sandpaper is diamond sandpaper with a particle size of 0.5 μm or 1 μm.

15. The method for grinding the wafer according to claim 13, wherein a grinding rotation speed of the grinder is less than 150 revolutions per minute.

16. A wafer failure analysis method, comprising:
    using the method for grinding the wafer according to claim 1 to grind a wafer, as to expose a test address; and
    using a nano-probe to perform a failure test on the test address.

17. The wafer failure analysis method according to claim 16, wherein the initial wafer is provided with a plurality of cutting lanes for dividing two adjacent bare chips; forming the recombined wafer comprises:
    cutting the initial wafer along the plurality of cutting lanes, as to form a plurality of cutting blocks, wherein each of the plurality of cutting blocks has a number of the bare chips; and
    splicing the plurality of cutting blocks, as to form the recombined wafer, so that the at least one of the plurality of bare chips having the test address being located in the middle of the recombined wafer.

18. The wafer failure analysis method according to claim 17, wherein said forming the plurality of cutting blocks comprises:
    cutting the initial wafer along one of the plurality of cutting lanes located in a middle of the initial wafer, as to form a first cutting block and a second cutting block, wherein an edge of the first cutting block comprises the at least one of the plurality of bare chips having the test address.

19. The wafer failure analysis method according to claim 18, wherein said splicing the first cutting block and the second cutting block comprises:
    providing a base; and
    pasting the first cutting block and the second cutting block on a surface of the substrate, and bonding the first cutting block and the second cutting block.

20. The wafer failure analysis method according to claim 19, wherein said pasting the first cutting block and the second cutting block on the surface of the substrate, and bonding the first cutting block and the second cutting block comprises:
    coating a first curing glue on the surface of the substrate;
    placing the first cutting block and the second cutting block on the surface of the substrate, wherein an edge of the first cutting block is aligned and connected with an edge of the second cutting block; and
    baking the first curing glue.

* * * * *